Figure 1:
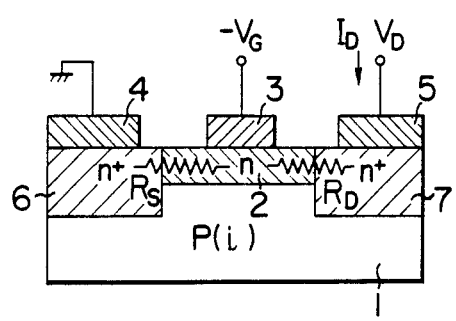

United States Patent [19]

Ueyanagi et al.

[11] Patent Number: 4,546,540
[45] Date of Patent: Oct. 15, 1985

[54] SELF-ALIGNED MANUFACTURE OF FET

[75] Inventors: Kiichi Ueyanagi; Yasunari Umemoto, both of Kokubunji; Susumu Takahashi; Michiharu Nakamura, both of Tokyo, all of Japan

[73] Assignee: Hitachi, Ltd., Tokyo, Japan

[21] Appl. No.: 531,709

[22] Filed: Sep. 13, 1983

[30] Foreign Application Priority Data

Sep. 16, 1982 [JP] Japan ................ 57-159611

[51] Int. Cl.$^4$ .............. H01L 29/48; H01L 29/80; H01L 21/308; H01L 21/265
[52] U.S. Cl. .............. 29/579; 29/571; 29/576 B; 29/591; 148/1.5; 148/187; 148/DIG. 143; 148/DIG. 83; 357/15; 357/22; 427/89; 427/90; 427/91; 156/643; 156/657
[58] Field of Search .............. 29/571, 576 B, 578, 29/589, 590, 591, 579; 148/175, 1.5, 187, 188; 357/15, 22, 91, 49; 427/89, 90, 91; 156/643, 644, 646, 657, 659.1, 652

[56] References Cited

U.S. PATENT DOCUMENTS

| | | | |
|---|---|---|---|
| 3,906,541 | 9/1975 | Goronkin | 357/15 X |
| 3,994,758 | 11/1976 | Ogawa et al. | 29/579 X |
| 4,048,712 | 9/1977 | Buiatti | 29/579 X |
| 4,075,652 | 2/1978 | Umebachi et al. | 357/15 X |
| 4,389,768 | 6/1983 | Fowler et al. | 29/571 |
| 4,393,578 | 7/1983 | Cady et al. | 148/187 X |
| 4,414,737 | 11/1983 | Mendo et al. | 29/591 X |
| 4,441,931 | 4/1984 | Levin | 357/15 X |

Primary Examiner—Brian E. Hearn
Assistant Examiner—David A. Hey
Attorney, Agent, or Firm—Antonelli, Terry & Wands

[57] ABSTRACT

This specification discloses a self-aligned manufacturing method of a Schottky gate FET. This method comprises the steps: forming a gate metallic layer on a semiconductor substrate and a mask overhanged on the metallic layer; ion-implanting impurity ions into the semiconductor substrate using the mask to form a source/drain region; depositing an insulator on the gate metallic layer side surface and the other surface below the mask; directionally etching said deposited insulator using the mask to expose the source/drain region; depositing a source/drain electrode using the mask; and removing the mask.

27 Claims, 13 Drawing Figures

SELF-ALIGNED MANUFACTURE OF FET

This invention relates to a high speed field effect transistor (FET) and particularly to a method of fabricating a self-aligned FET suitable to high speed operation.

The field effect transistor (FET) includes an insulated gate FET, a junction gate FET and a Schottky gate FET. A self-aligned step has been developed in the insulated gate FET. A field oxide layer, a gate insulating film and a gate electrode (including a poly-silicon electrode) are formed on a semiconductor substrate and thereafter by using these layers as a mask, impurities are doped in the semiconductor substrate through diffusion or ion implantation to define source and drain regions.

The self-aligned step can relax diffusion (or ion implantation) mask precision requirement, prevent any errors in mask alignment and reduces source and drain series resistances.

The self-aligned step is also effectively used in the Schottky gate FET. However, since the Schottky gate FET has a gate electrode metal layer directly covering the semiconductor substrate, and the gate metal which is in Schottky contact to the substrate reacts on the semiconductor substrate, the self-aligned step used in the insulated gate FET cannot be directly adopted to the Schottky gate FET. An appreciable gap between the gate electrode and the source/drain electrode accompanies an appreciable source/drain series resistance which cause several disadvantages.

Concerning self-aligned Schottky gate FET, reference is made to IEEE International Solid State Circuit Conference (ISSCC) 81, Feb. 20, 1981, pages 218–219, Japanese Patent Kokai (Laid-Open) No. Sho. 57-128071 specification.

An object of this invention is to provide a method of manufacturing a Schottky gate FET using self-aligned step.

Another object of this invention is to provide a method of manufacturing an FET of less degradation and high reliability by self-aligning a source/drain electrode as well as a source/drain region to the gate electrode.

According to an aspect of this invention, a gate electrode, a mask overhanging the gate electrode and an insulator layer on the side surface of the gate electrode covered with the overhang mask are formed and thereafter a source/drain electrode are formed by using this mask. This mask may also be used to form a highly doped source/drain region in the semiconductor substrate. Reduced pressure deposition is preferably used to form the insulator layer and plasma CVD is more preferably used. Before forming the source/drain electrode, directional etching of a part of the insulator layer (e.g. reactive sputter etching or reactive ion etching) preferably exposes the semiconductor substrate surface in accordance with a mask shape. The overhang mask may be a silicon oxide layer or a stacked layer of a silicon oxide and a photoresist layer thereon. The insulator layer covering the side surface of the gate electrode may be made of oxide or nitride or the combinations thereof. The semiconductor substrate may be GaAs, Si, InP, GaSb, Ge, GaAlAs or the like. The gate electrode may be formed of Ti, W, Ta, Hf, alloys thereof, silicide or nitride thereof; or a multilayer consisting of these materials.

Figure 2:
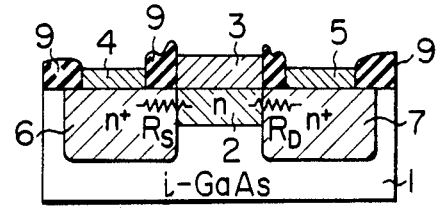
Figure 3A:
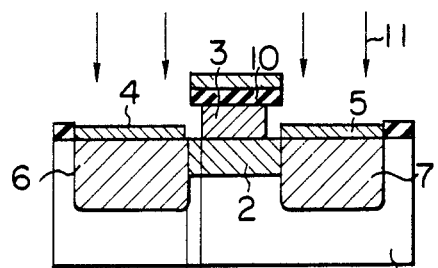
Figure 3B:
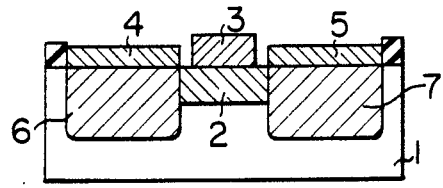
Figure 4:
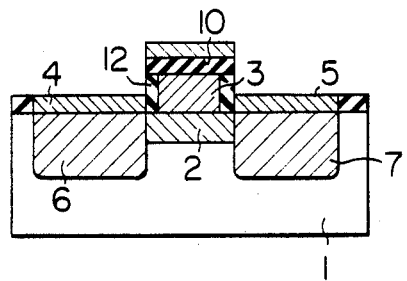

The present invention will be apparent from the following detailed description taken in conjunction with the accompanying drawings, in which:

FIG. 1 is a sectional view of an FET;
FIGS. 2, 3A and 3B are sectional views of the conventional self-aligned FET;
FIG. 4 is a sectional view of an FET according to this invention;
FIGS. 5A to 5H are sectional views of an FET illustrating a manufacturing process according to one embodiment of this invention.

To assist the understanding of this invention, the operation and examples of the prior art Schottky gate FET are now explained. The same reference numbers denote like parts in the respective figures.

FIG. 1 shows an n-type channel Schottky gate FET composed of a semi-insulating or p-type semiconductor substrate 1 such as GaAs, Si, etc., an n-type channel region 2 formed in the substrate surface region, a gate electrode 3 being in Schottky contact to the channel region 2, source and drain electrodes 4 and 5 for supplying and deriving a main current, and highly doped n-type source and drain regions 6 and 7 and for establishing ohmic contacts to the electrodes 4 and 5. The gate voltage $-V_G$ applied to the gate electrode 3 establishes a depletion layer in the channel region 2 and controls the electrons flowing from the source region 6 to the drain region 7 through the channel region 2 (i.e. drain current $I_D$ flowing from the drain region 7 to the source region 6) when drain voltage $V_D$ (having the positive polarity with respect to the source electrode) is applied to the drain electrode 5. Since a Schottky barrier exists at the Schottky contact between the gate electrode 3 and the channel region 2, carrier injection from the gate electrode 3 does not occur but a channel width is controlled by electric field. In case where the channel region 2 is already pinched off by the zero-bias contact (or built-in) potential, the FET is of normally-off type and a forward gate bias is applied to allow a main current (E mode operation). Apparently, the source and the drain can be used in interchanged manner, particularly when they are symmetric.

In the transistor made by the conventional photolithography technique, mask alignment precision limits the distance between the gate electrode 3 and the source and drain electrodes 4 and 5, so that this distance must be at least about 1–1.5 $\mu$m. Thus, the gate-source series resistance (source resistance) $R_S$ and the gate-drain series resistance (drain resistance) $R_D$ are commonly as large as several tens ohms, respectively, which results in large voltage drop thereacross $\Delta V = I_D(R_S + R_D)$. Accordingly, a large drain current $I_D$ is not easily obtainable. Owing to negative feedback by the source resistance, particularly, the transconductance of the transistor is small. The RC time constant is large, which degrades the operation speed.

Therefore, it is important to reduce the source and drain resistances (particularly the source resistance) to improve the transistor performance. To this end, such an FET as will be now explained has been proposed.

The GaAs FET shown in FIG. 2 has source and drain regions 6 and 7 which are brought as close as possible to the gate electrode 3 by self-aligning these regions to the gate electrode 3. The carrier concentration of the source/drain region 6, 7 is about $1 \times 10^{18}$ cm$^{-3}$, for example, which is one order of magnitude higher than that of the channel region 2, permitting $R_S$ in FIG. 2 to be lower than $R_S$ in FIG. 1 (e.g. about 1/10). Regarding this type of FET structure, reference is made to ISSCC (IEEE International Solid State Circuit Conference) 81, Feb. 20, 1981, pp. 218-219. The source and drain electrodes 4, 5 of FET shown in this structure are made by the conventional photolithography so that the distance between the gate electrode 3 and the source/drain region 6, 7 cannot be decreased, which is as long as 1–1.5 μm. The source resistance $R_S$ is usually limited by the lower limit of 10 Ω. Incidentally, numeral 9 denotes an insulating passivation film.

The Schottky gate FET shown in FIGS. 3A and 3B has been proposed with regard to the selfalignment of the source/drain electrode to the gate electrode (see Japanese Patent Kokai (Laid-Open) No. sho. 57-128071 specification): FIG. 3A shows a manufacturing process while FIG. 3B shows a resultant FET. In this FET, a gate electrode 3, a channel region 2 and highly doped regions 6, 7 are formed as in FIG. 2, and thereafter the gate electrode 3 is side-etched by a width g using an insulating film 10 thereon as a mask to separate the gate electrode 3 from the source/drain regions 6, 7. A metallic film for forming the source/drain electrodes 4, 5 is deposited in a direction, as shown by the arrow 11, vertical to a substrate 1 using the insulating film 10 as a mask. The resultant source electrode 4 and drain electrode 5 are separated by a side-etched distance g as shown in FIG. 3A. Removing the insulating film 10 accomplishes a Schottky gate FET as shown in FIG. 3B. The side-etched distance g can be controlled in the range of 0.1–0.4 μm, allowing the source resistance to be less than several ohms.

However, the inventors have discovered with regard to this FET that there are air gaps between the gate electrode 3 and the source/drain electrode 4, 5 as shown in FIG. 3B and metallic particles are adhered on the exposed GaAs surface between the gate electrode 3 and the source/drain electrode 4, 5 during the deposition of metal, causing short-circuiting therebetween or causing the FET performance to be deteriorated.

FIG. 4 shows one embodiment of a Schottky gate FET according to this invention. This FET is different from the FET shown in FIG. 3A in the point that an insulator region 12 exists on the substrate surface between a gate electrode 3 and a source/drain electrode 4, 5. The insulator region 12 isolates the gate electrode 3 from the source/drain electrode 4, 5 and passivates the substrate surface so as to prevent surface exposure. This insulator region is made in the following manner. The gate electrode 3 is side-etched to reach the underside of the mask 10 to make an intermediate structure such as shown in FIG. 3A (without the metal deposition 4, 5), an insulator region is formed on the intermediate structure surface including the side surface of the gate electrode and the insulator region is selectively removed to expose the source/drain surface while leaving the insulator region on the side surface of the gate electrode. The mask 10 is effectively used in the respective self-alignment steps of making: a gate electrode; source/drain regions; an insulator region; and source/drain electrodes. After these self-alignment steps, the mask is removed. It is preferably that the insulator region 12 is difficult to be etched during the etching process of the mask 10. Apparently, it is desired in each etching step that the ratio of etching rate of the etched material to that of the mask material is as high as possible and is preferably at least about 2:1 and more preferably not smaller than about 5:1.

According to this embodiment, the source/drain electrodes 4, 5 as well as the source/drain regions 6, 7 can be brought as close as possible to the gate electrode 3, thereby making a less degradation and high reliability FET device.

FIGS. 5A–5H show a fabrication process of a self-aligned FET according to one embodiment of this invention. Each figure shows a sectional view of a semiconductor device.

Figure 5A:
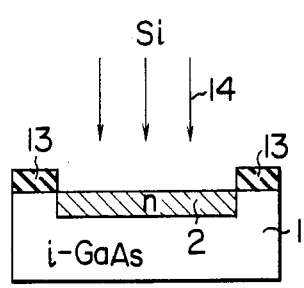

FIG. 5A shows a channel region fabricating step. A photoresist film 13 about 1 μm thick is formed on a semi-insulating GaAs substrate 1, an FET part is photo-etched, Si ions 14 are implanted with a dose of about $2 \times 10^{12}$/cm² at the acceralating voltage of about 75 kV, the photoresist film 13 is removed, and the substrate 1 is annealed at about 850° C. Thus, a channel region 2 is formed. The carrier concentration of the channel region 2 was about $1 \times 10^{17}$ cm$^{-3}$ at the maximum.

Figure 5E:
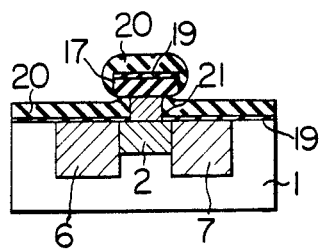
Figure 5B:
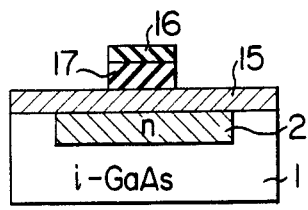

As shown in FIG. 5B, an alloy film 15 of Ti/W (containing 10–30% Ti) is deposited on the GaAs surface by sputtering. An SiO₂ film 17 (about 3000 Å) and a photoresist film 16 (about 1 μm thick) are formed on the Ti/W film 15. A pattern mask for a gate electrode is formed by photoetching. As shown in FIG. 5C, the Ti/W film 15 is etched so as to make a suitable undercut using the above pattern mask, thereby forming a side-etched gate electrode 3. The etching is performed by a reactive ion etching technique using ($CF_4 + O_2$) gas containing about 4% $O_2$ at about 0.3 Torr. Input power was about 13.6 MHz, about 150 W. This dry etching produces about 0.1–0.4 μm undercut part from the edge of the mask 10 comprising films 16, 17 to the inside by etching the gate electrode 3. In other words, the mask 10 has an overhang part (about 0.1–0.4 μm) from the gate electrode edge to the outside. It may be obvious that various isotropic etchings can be employed as well for forming a desired side-etch.

Figure 5F:
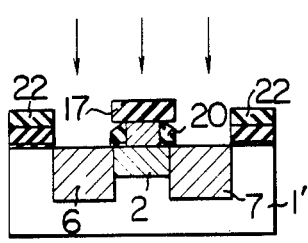
Figure 5C:
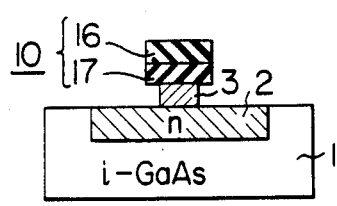
Figure 5G:
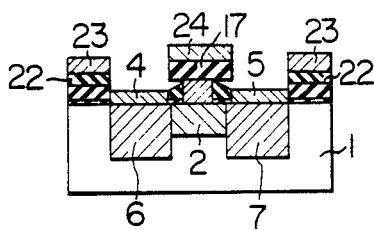
Figure 5D:
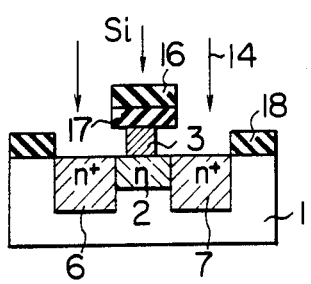

As shown in FIG. 5D, an outer periphery of the source/drain regions is covered with a photoresist film 18 and Si ions 14 are implanted at acceralating voltage of about 120 kV (peak concentration: about $1 \times 10^{18}$ cm$^{-3}$). The photoresist films 16 and 18 are removed and the substrate is annealed for about 15 minutes at 850° C. thereby to form source/drain regions 6, 7. This annealing step may be effected after the fabrication of insulating films 19, 20 described hereinbelow. Thus, the highly doped source/drain regions are self-aligned to the gate electrode. Such an intermediate structure is equivalent to that of FIG. 3A except for source/drain electrodes.

As shown in FIG. 5E, an SiO₂ film 19 about 500 Å thick is deposited on the entire substrate surface by chemical vapor deposition (CVD) at the atmospheric pressure and thereafter a silicon nitride film 20 is deposited on the intermediate structure including the side surface of the gate electrode by plasma CVD at a reduced pressure using ($SiH_4 + N_2$) gas of about 0.3 Torr at substrate temperature of 350° C. Input power was about 13.6 MHz, about 200 W. The silicon nitride film may also be deposited by sputtering process instead of plasma CVD. The side surface 21 of the gate electrode 3 is covered with the silicon nitride film 20 to embed the undercut portion, by the reduced pressure deposition step which enables the shadowed side surface to be deposited. Incidentally, the SiO₂ film 19 is deposited to prevent damage of the GaAs substrate surface which may occur during the silicon nitride deposition. Therefore, SiO₂ layer 19 is not always required. Moreover, only a SiO₂ layer in proper thickness may be used instead of the silicon nitride film 20 and the SiO$_2$ film 19. Further, aluminium nitride AlN may also be used as the insulator. The process for depositing the insulator may be any one such as reduced pressure CVD, sputtering, reactive sputtering, etc. provided that it can coat a side surface.

Next, as shown in FIG. 5F, the outer periphery of the source/drain region 6, 7 is covered with a photoresist film 22. The silicon nitride film 20 is removed by a directional reactive ion etching using (CF$_4$+O$_2$) gas of about 0.23 Torr. The etching gas contains small amounts of N$_2$ and H$_2$. Input power was about 250 W. This directional reactive ion etching etches the silicon nitride film 20 in accordance with the shapes of the masks 17, 22. The SiO$_2$ film 19 is etched using an etching liquid (hydrofluoric acid (HF): ammonium fluoride (NH$_4$F)=1:10). The SiO$_2$ film 19 is etched in accordance with the shape of the silicon nitride film 20 since the SiO$_2$ film is as thin as about 500 Å. Thus, the photoetching to the source/drain regions is effected with the gate electrode side surface being covered with the insulating region. As shown in FIG. 5G, a multimetallic film consisting of AuGe and Ni (about 2000–6000 Å thick) is deposited on the photoetched (exposed) portions to form source/drain electrodes 4, 5. Thus, the source/drain electrodes 4, 5 are also self-aligned to the gate electrode 3.

Figure 5H:
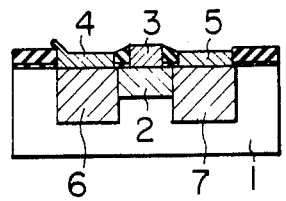

At the final step, the metallic film 23, which is deposited on the part other than the source/drain regions, is lifted off by resolving the photoresist film 22, and the metallic film 24 deposited above the gate electrode 3 is lifted off by resolving the SiO$_2$ film 17. Accordingly, an FET device such as shown in FIG. 5H is accomplished.

It is evident that various changes and modifications are possible without departing from the concept of this invention. InP, Si, GaSb, Ge, GaAlAs, etc. other than GaAs used in the embodiment may be also employed as a substrate. In case of Si, dopant species may be B, As, etc. as is well known. Silicide or nitride of Ti, W, Hf, Ta, alloys thereof or a stacked layer of these materials may be used as a Schottky electrode.

As explained in detail above, according to this embodiment, the source/drain electrodes as well as the highly doped source/drain regions can be self-aligned to the gate electrode so that an FET can be made with a very small insulating gap between the electrodes and the source resistances can be reduced to the minimum to realize high speed operation of an FET.

Since the source/drain regions are separated by the gate electrode through the insulating film, dielectric breakdown occurs with less possibility. Since the GaAs surface is entirely covered with the metallic film or insulating film, a high reliability FET device can be obtained.

The source/drain electrodes 4, 5 may be formed on the substrate without accompanying the step of implanting the source/drain regions 6, 7, provided that carrier-supplying and retrieving functions are fulfilled. In such a case, ion-implantation step for the source/drain regions 6, 7 is dispensed with.

The etching for exposing source/drain contact area may be of any type provided that the insulator on the side surface of the gate electrode is properly left. Use of a dc substrate bias, a lower gas pressure, etc. in dry-etching may also be used for enhancing directivity of etching.

We claim:

1. A method of manufacturing a Schottky gate FET comprising the steps of:
   (a) forming a gate electrode of metallic material and a mask member on a semiconductor substrate, said gate electrode of metallic material being in Schottky contact to the semiconductor substrate, said mask member overhanging a periphery of the gate electrode;
   (b) ion-implanting impurities into the semiconductor substrate using said mask member as a mask, to form a source region and a drain region thereby forming an intermediate structure;
   (c) depositing insulator on a surface of the intermediate structure, including a side surface of the gate electrode overhung by the mask member;
   (d) etching said deposited insulator to expose the source region and the drain region using at least said mask member as a mask, while leaving the insulator at least at the side surface of the gate electrode; and
   (e) forming a source electrode and a drain electrode on the exposed source and drain regions.

2. A method of manufacturing a Schottky gate FET according to claim 1 wherein said insulator depositing step includes vapor-depositing nitride at a reduced pressure.

3. A method of manufacturing a Schottky gate FET according to claim 2 wherein said nitride depositing step comprises plasma chemical vapor deposition (CVD).

4. A method of manufacturing a Schottky gate FET according to claim 2 wherein said etching step includes dry etching using (CF$_4$+O$_2$) gas containing small amounts of N$_2$ and H$_2$.

5. A method of manufacturing a Schottky gate FET according to claim 1 wherein said deposited insulator comprises an oxide underlie deposited at atmospheric pressure and a nitride layer deposited thereon at a reduced pressure.

6. A method of manufacturing a Schottky gate FET according to claim 5 wherein said etching step includes dry etching using (CF$_4$+O$_2$) gas containing small amounts of N$_2$ and H$_2$ and wet etching using etching liquid containing hydrofluoric acid.

7. A method of manufacturing a Schottky gate FET according to claim 1 wherein said etching step comprises directional etching.

8. A method of manufacturing a Schottky gate FET according to claim 1 wherein said etching step includes dry etching.

9. A method of manufacturing a Schottky gate FET according to claim 1 wherein said step of forming a gate electrode includes forming an oxide film and a photoresist film on a gate electrode metallic material, photoetching the oxide film using the photoresist film as a mask, and etching the gate electrode metallic material using the photoresist film and the oxide film as a mask.

10. A method of manufacturing a Schottky gate FET according to claim 9 wherein said etching of the gate electrode includes plasma etching using (CF$_4$+O$_2$) gas.

11. A method of manufacturing a Schottky gate FET according to claim 10 wherein said plasma etching provides a side-etch of about 0.1–0.4 μm from an edge of the mask member.

12. A method of manufacturing a Schottky gate FET according to claim 10 wherein said depositing step includes depositing thin oxide film on the semiconductor substrate surface and a nitride film thicker than the oxide film thereon.

13. A method of manufacturing a Schottky gate FET according to claim 12 wherein said depositing step is effected by CVD.

14. A method of manufacturing a Schottky gate FET according to claim 13 wherein said etching step is dry etching using a gas containing $CF_4$ achieved under a reduced pressure.

15. A method of manufacturing a Schottky gate FET according to claim 14 wherein said reduced pressure dry etching is effected in an atmosphere of a reduced pressure mixed ($CF_4+O_2$) gas containing small amounts of $N_2$ and $H_2$.

16. A method of manufactruing a Schottky gate FET according to claim 14 wherein said gate metallic material contains at least one of Ti/W, silicides and nitrides of Ti,W, Ti/W, Ta and Hf.

17. A method of manufacturing a Schottky gate FET according to claim 1 wherein the source and drain electrodes are formed without removing the insulator at the side surface of the gate electrode, whereby the source and drain electrodes are formed in self-alignment with the overhanging mask and insulator and short-circuiting between the gate electrode and source and drain electrodes is prevented.

18. A method of manufacturing a Schottky gate FET according to claim 1 wherein after forming the source and drain regions said mask member is removed, with said insulator at the side surface of the gate electrode being left.

19. A method of manufacturing a Schottky gate FET according to claim 1, wherein said insulator depositing step includes depositing nitride by sputtering.

20. A method of manufacturing a Schottky gate FET according to claim 1 wherein said insulator is AlN.

21. A method of manufacturing a Schottky gate FET according to claim 1, wherein both the source and drain regions, and the source and drain electrodes, are formed in self-alignment with the gate electrode.

22. A method of manufacturing a Schottky gate GaAs FET comprising the steps of:
 forming a Schottky gate electrode on a GaAs substrate and a mask member overhanging the gate electrode, the gate electrode being formed of a material selected from the group consisting of Ti, W, alloy of Ti and W, Ta, Hf, silicides and nitrides thereof, the overhanging mask including a silicon oxide layer;
 depositing an insulator layer on the exposed surfaces of the substrate, the gate electrode and the mask member, the insulator layer including a silicon nitride layer;
 directionally etching the insulator layer using said mask member as an etching mask to expose part of the GaAs substrate; and
 depositing current electrode on the exposed part of the GaAs substrate.

23. A method of manufacturing a Schottky gate GaAs FET according to claim 22, wherein said step of forming a Schottky gate electrode includes isotropic dry etching utilizing a fluorine-containing gas.

24. A method of manufacturing a Schottky gate GaAs FET according to claim 22, wherein said directional etching step includes anisotropic reactive dry etching utilizing a fluorine-containing gas having a higher etching rate for silicon nitride than for silicon oxide.

25. A method of manufacturing a Schottky gate GaAs FET according to claim 22 wherein the deposited insulator layer includes a portion covering the side surface of the gate electrode, and, in directionally etching the insulator layer, insulator material is left at least at the side surface of the gate electrode, and said current electrode is deposited without prior removal of the insulator at the side surface of the gate electrode, whereby short-circuiting between the gate electrode and current electrode can be prevented and the current electrode is formed in self-alignment with the overhanging mask and insulator.

26. A method of manufacturing a Schottky gate FET, comprising the steps of:
 forming a shallow doped region in a surface of a semiconductor substrate;
 depositing a layer of Schottky material on the surface of the semiconductor substrate to form a Schottky contact therewith;
 forming an insulator layer on the surface of the layer of Schottky material;
 patterning the insulator layer to form a mask member;
 overly etching the layer of Schottky material using said mask member as an etching mask to form a Schottky gate electrode and to indent the side surface of the Schottky gate electrode below the mask member;
 depositing another insulator layer at least on the side surface of the Schottky gate electrode;
 directionally etching said another insulator layer using said mask member as an etching mask to expose the substrate surface; and
 depositing a metal layer on the exposed substrate surface.

27. A method of manufacturing a Schottky gate FET according to claim 26 wherein, in directionally etching said another insulator layer, a portion of said another insulator layer is left at least on the side surface of the Schottky gate electrode, and said metal layer is deposited without prior removal of said another insulator layer left at least on the side surface of the Schottky gate electrode, whereby the metal layer is deposited in self-alignment with the mask member and another insulator layer and short-circuiting between the Schottky gate electrode and the metal layer can be prevented.

* * * * *